(12) United States Patent
Chen et al.

(10) Patent No.: US 10,816,593 B2
(45) Date of Patent: Oct. 27, 2020

(54) ARRANGEMENT UNIT, TESTING SYSTEM AND TESTING METHOD

(71) Applicant: PEGATRON CORPORATION, Taipei (TW)

(72) Inventors: Chih-Ho Chen, Taipei (TW); Wen-Pin Li, Taipei (TW); Guo-Yuan Tseng, Taipei (TW); Yu-Ting Chen, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 313 days.

(21) Appl. No.: 15/935,065

(22) Filed: Mar. 26, 2018

(65) Prior Publication Data

US 2018/0321303 A1 Nov. 8, 2018

(30) Foreign Application Priority Data

May 3, 2017 (TW) .............................. 106114697 A

(51) Int. Cl.
  *G01R 31/28* (2006.01)
  *G01R 31/01* (2020.01)
(52) U.S. Cl.
  CPC ......... *G01R 31/2834* (2013.01); *G01R 31/01* (2013.01)
(58) Field of Classification Search
  CPC .......................... G01R 31/2834; G01R 31/01
  USPC .................................................. 702/82
  See application file for complete search history.

(56) References Cited

U.S. PATENT DOCUMENTS

| | | | |
|---|---|---|---|
| 2011/0208448 A1* | 8/2011 | Tamura ............ | G01R 31/31907 702/58 |
| 2016/0259700 A1* | 9/2016 | Volkmann ............ | G06F 11/273 |

FOREIGN PATENT DOCUMENTS

TW 411498 B 11/2000

\* cited by examiner

*Primary Examiner* — Michael P Nghiem
*Assistant Examiner* — Dacthang P Ngo
(74) *Attorney, Agent, or Firm* — McClure, Qualey & Rodack, LLP

(57) ABSTRACT

A testing system is suitable for receiving at least one testing item of multiple device under tests (DUTs). The testing system comprises a plurality of testing devices and an arrangement unit. The arrangement unit is coupled to the testing devices. The arrangement unit generates at least one testing instruction according to the at least one testing item and detects an idle state corresponding to the at least one testing instruction, and transmits the at least one testing instruction to the testing device in the idle state, so as to trigger the testing device in the idle state to test the corresponding DUT according to the at least one testing instruction and generate a testing result.

9 Claims, 5 Drawing Sheets

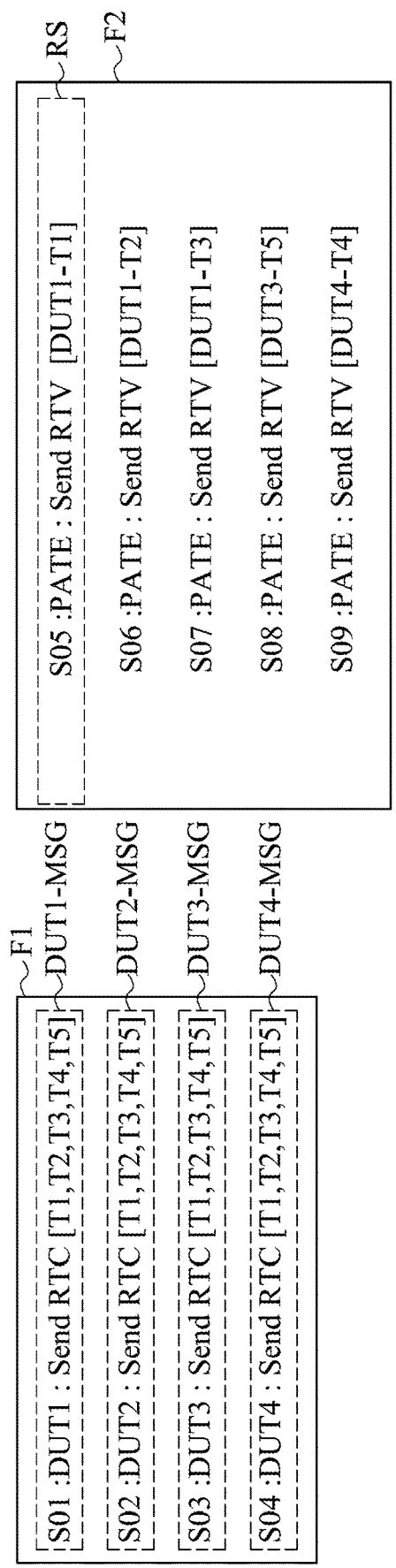
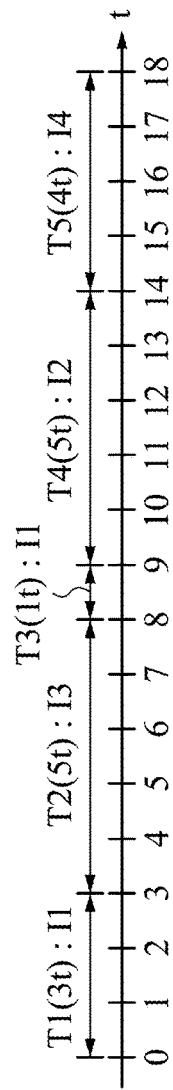
Fig. 3
Fig. 4
Fig. 5

ARRANGEMENT UNIT, TESTING SYSTEM AND TESTING METHOD

RELATED APPLICATIONS

This application claims priority to Taiwan Application Serial Number 106114697, filed May 3, 2017, which is herein incorporated by reference.

BACKGROUND

Technical Field

The disclosure relates to an arrangement unit, a testing system and a testing method, particularly to an arrangement unit, a testing system and a testing method for testing according to the disposition of the testing device in the idle state.

Description of Related Art

In tradition, in the process of producing products, testing for products is usually necessary, and the most common method of testing products is the one-to-one testing, that is, a device under test is tested by a testing equipment. When a plurality of device under tests need to be tested with various items by various testing equipment, for example, when the device under tests are ten mobile phones and each mobile phone needs to be tested its communication function, screen function and sound function, each mobile phone needs to be sequentially placed into communication testing equipment, screen testing equipment and sound testing equipment to complete a plurality of testing items.

However, in the traditional testing method, testing items are sequential. Suppose a mobile phone A and a mobile phone B both need to be tested, and both the order of their testing items are communication testing, touch testing and sound testing. When the mobile phone A has completed the communication testing while the mobile phone B is performing touch testing, the mobile phone A needs to wait for the mobile phone B to complete the touch testing before being tested, and the mobile phone A cannot perform sound testing first. This causes the sound testing device to be in idle state and the mobile phone A to be in a waiting state, resulting in an increase in the total idle time of the testing device and an excessive waiting time of the overall testing flow. Furthermore, in another traditional method, although the testing items may be non-sequential, a time slot must be set, and the time slot is dominated by the longest time of a plurality of testing devices. Therefore, other testing devices need to wait for the testing device with the longest testing time to complete, then to continue testing the device under tests, even though the other testing devices have completed the testing of the device under tests. As a result, the total idle time of the testing devices is also increased and the time consumption of the testing process increases.

SUMMARY

The disclosure provides an arrangement unit, a testing system and a testing method configured to solve the problem of increasing the total idle time of the testing devices and increasing the time consumption of the testing process.

One aspect of the present disclosure is a testing system suitable for receiving at least one testing item from a plurality of device under tests including a plurality of testing devices and an arrangement unit. These testing devices are configured to correspond to at least one testing item to test these device under tests. The arrangement unit is electrically connected to a plurality of testing devices. The arrangement unit generates at least one testing instruction according to at least one testing item, detects an idle state of these testing devices corresponding to at least one testing item, and transmits at least one testing instruction to the corresponding testing device in idle state, so that the testing device in the idle state tests the corresponding device under test according to the at least one testing instruction and generates a testing result.

Another aspect of the disclosure is a testing method suitable for a testing system. The testing system includes a plurality of testing devices and an arrangement unit. The testing method includes the following steps: receiving at least one testing item from a plurality of device under tests by the arrangement unit; detecting an idle state of the testing devices corresponding to the at least one testing item message by the arrangement unit; generating at least one testing instruction according to the at least one testing item by the arrangement unit; transmitting the at least one testing instruction to the corresponding testing device in the idle state by the arrangement unit; and testing the corresponding device under test according to the at least one testing instruction and generating a testing result by the testing device in the idle state.

Yet another aspect of the present disclosure is an arrangement unit suitable for receiving at least one testing item of a plurality of device under tests and electrically connected to a plurality of testing devices. The arrangement unit includes a communication interface and a processor. A communication interface is configured to receive the at least one testing item. A processor is electrically connected to the communication interface, and configured to generate at least one testing instruction according to the at least one testing item, detect an idle state of the testing devices corresponding to the at least one testing item, and transmit the at least one testing instruction to the corresponding testing device in the idle state, such that the testing device in the idle state is configured to test the corresponding device under test according to the at least one testing instruction and generate a testing result.

BRIEF DESCRIPTION OF THE DRAWINGS

FIG. 3 is a schematic diagram of a testing item file in accordance with an embodiment of the disclosure;

FIG. 4 is a schematic diagram of a testing result file illustrated in accordance with an embodiment of the disclosure;

FIG. 5 is a schematic diagram of a testing item, time and a corresponding testing device illustrated in accordance with an embodiment of the disclosure;

DETAILED DESCRIPTION

The following diagrams and detailed description clearly explains the spirit of the present disclosure, various alterations and modifications can be performed on the present disclosure by those of ordinary skills in the art without departing from the principle and spirit of the present disclosure.

As used in this specification, the terms "comprising," "including," "having," "containing," "involving," and the like are to be understood to be open-ended, i.e., to mean including but not limited to.

As used in this specification, the term "and/or" includes any and all combinations of one or more of the associated listed items.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Figure 1:
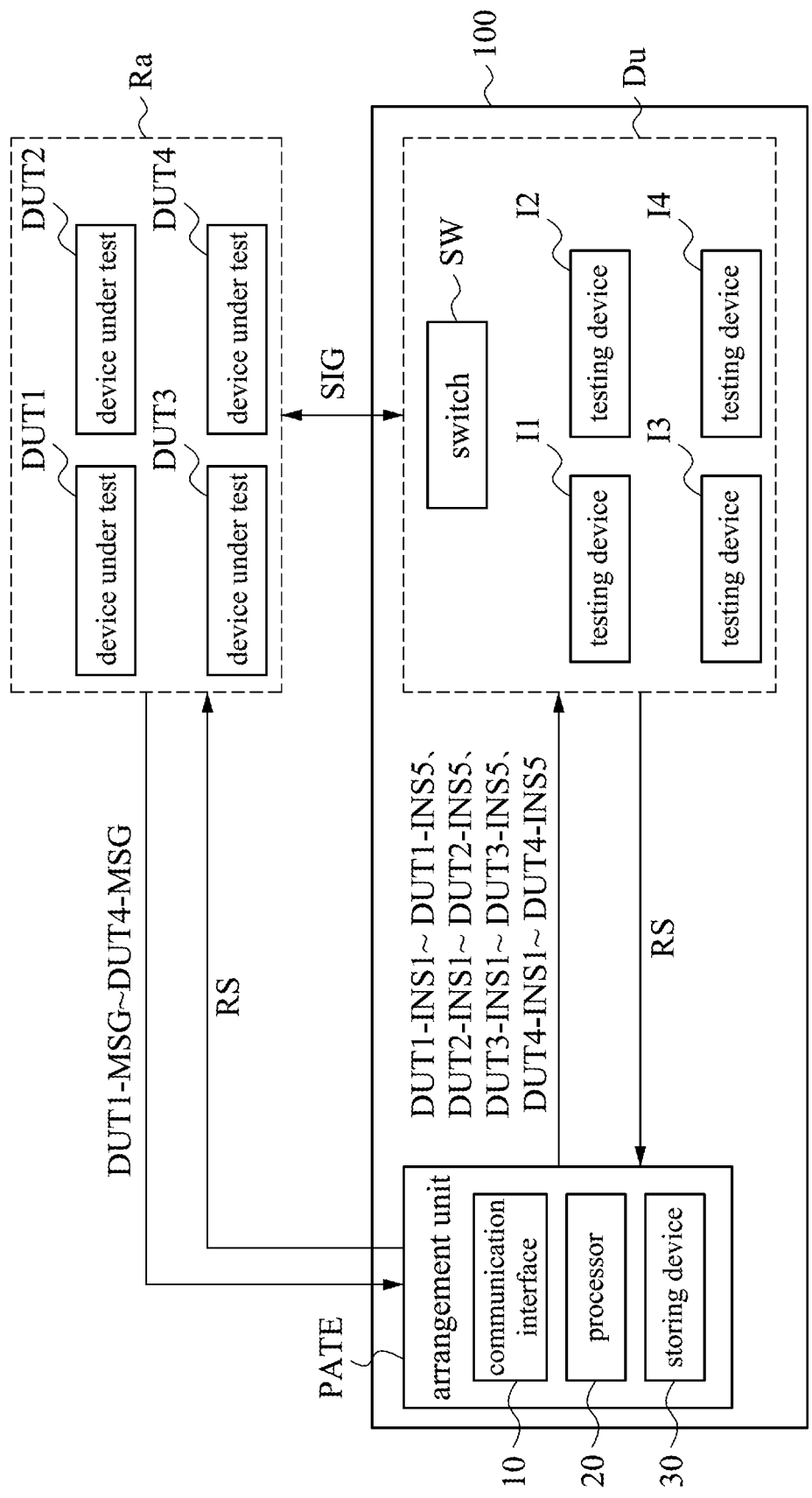
FIG. 1 is a block diagram of a testing system illustrated in accordance with an embodiment of the disclosure.
Figure 2:
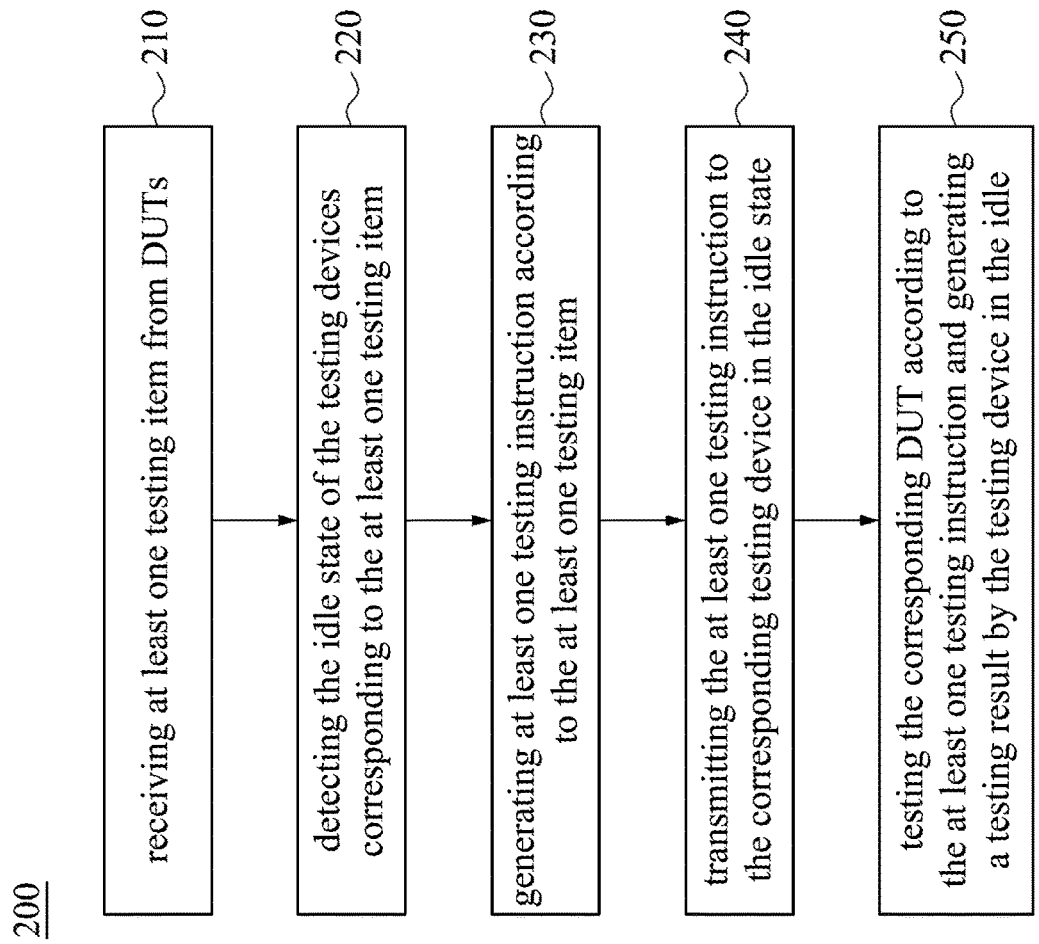
FIG. 2 is a flow chart of a testing method illustrated in accordance with an embodiment of the disclosure.

Please refer to FIGS. 1 to 3. FIG. 1 is a block diagram illustrating a testing system 100 in accordance with an embodiment of the disclosure. FIG. 2 is a flow chart illustrating a testing method 200 in accordance with an embodiment of the disclosure. FIG. 3 is a schematic diagram illustrating a testing item file F1 in accordance with an embodiment of the disclosure. Furthermore, in the following embodiments, there are four device under tests, five testing items for each device under tests, and four testing devices. The number of the device under tests, testing items and testing devices are only examples and should not be limited to this.

In FIG. 1, the testing system 100 includes an arrangement unit PATE and an equipment unit Du, which includes four testing devices I1~I4, in which the arrangement unit PATE is electrically connected to the testing devices I1~I4. However, the present disclosure is not limited to this, the arrangement unit PATE and the equipment unit Du may also be separately located in different hosts or be separately located alone.

The arrangement unit PATE may be realized by a computer or a device with calculation function. In an embodiment, the arrangement unit PATE may be a parallel auto testing engine. In an embodiment, the arrangement unit PATE includes a communication interface 10, a processor 20 and a storing device 30. The communication interface 10 may be realized by a USB, a device with near field communication (NFC) function, Bluetooth function, WiFi function or other wireless/wired data receiving or transmitting function. The processor 20 is configured to execute various operations and generate various instructions or signals, and may be realized by an integrated circuit such as a micro controller, a microprocessor, a digital signal processor, an application specific integrated circuit (ASIC) or a logic circuit. The storing device 30 may be realized by a hard drive, a memory or a USB.

In the step of 210, the arrangement unit PATE receives at least one testing item T1~T5 from a plurality of device under tests DUT1~DUT4 (as shown in FIG. 3.) In an embodiment, the communication interface 10 builds a signal channel between the arrangement unit PATE and device under tests DUT1~DUT4, the testing item messages DUT1-MSG~DUT4-MSG are transmitted to the arrangement unit PATE by the communication interface 10.

The device under tests DUT1~DUT4 are placed in the test area Ra, in which the device under tests DUT1~DUT4 may be, for example, a cable modem, a set-top box, a router and/or a mobile device. In an embodiment, device under tests DUT1~DUT4 may be the same type or different types of device under tests.

As shown in FIG. 3, device under tests DUT1~DUT4 may package the testing items T1~T5 into the testing item messages DUT1-MSG~DUT4-MSG, and transmit the testing item messages DUT1-MSG~DUT4-MSG to the arrangement unit PATE. Each of the testing items T1~T5 corresponds to a testing item of a voltage testing item, a frequency testing item, a testing item of a control signal of a cable modem, a testing item of a video high definition multimedia interface (video HDMI), and a LED testing item.

In other embodiments, the different device under tests DUT1~DUT4 may request to be tested different types of testing items T1, T2, T3, T4 and/or T5 respectively. For example, if the device under test DUT1 is a mobile device, the testing item message DUT1-MSG generated by the device under test DUT1 includes the testing item T4 of the video HDMI and the testing item T5 of the LED screen. When the device under test DUT2 is a cable modem, the testing item message DUT2-MSG generated by the device under test DUT2 includes the voltage testing item T1 and the frequency testing item T2.

The arrangement unit PATE integrates the testing item messages DUT1-MSG~DUT4-MSG received successively or simultaneously into the testing item file F1, as shown in FIG. 3. The arrangement unit PATE may store the testing item messages DUT1-MSG~DUT4-MSG in the storing device 30. The testing item messages DUT1-MSG~DUT4-MSG are described in a high-level programming language. Each testing item message DUT1-MSG~DUT4-MSG may include a plurality of testing items T1~T4. For example, in the testing item file F1 of FIG. 3, the line code S01 of the code is described as "S01: DUT1: Send RTC [T1, T2, T3, T4, T5]" configured to define: the device under test DUT1 transmitting the testing items T1, T2, T3, T4, T5 to the arrangement unit PATE. In which, the "RTC" representing the request test command is a pre-defined program language. Furthermore, each row in FIG. 3 represents a testing item message (for example, the row of line code S01 represents the testing item message DUT1-MSG, the row of line code S02 represents the testing item message DUT2-MSG) and so as content of line code S03~S04, the details will not be repeated here.

Accordingly, the testing item messages DUT1-MSG~DUT4-MSG are described by high-level programming language, so that the device under tests DUT1~DUT4 only need to provide the testing request to the arrangement unit PATE (for example, the testing item T1 represents the voltage testing.) The device under tests DUT1~DUT4 do not need to know whether to use oscilloscope or date acquisition (DAQ) to test, and about how to choose the testing device, at least one of the suitable testing devices I1~I4 will be disposed to test by the arrangement unit PATE.

In addition, the device under tests DUT1~DUT4 may transmit the testing item messages DUT1-MSG~DUT4-MSG to the arrangement unit PATE in a divided or one-time manner, and a plurality of testing item messages DUT1-MSG~DUT4-MSG may be transmitted to the arrangement unit PATE without any sequence. In other word, once the device under tests DUT1 needs to be tested, it may immediately send its own testing item message DUT1-MAG to the arrangement unit PATE.

In the step 220, the arrangement unit PATE detects the idle state of the plurality of testing devices I1~I4 corresponding to the at least one testing item T1~T5.

In an embodiment, after the arrangement unit PATE received at least one testing item message DUT1-MSG~DUT4-MSG, the arrangement unit PATE detects the idle state of the plurality of testing devices I1~I4 corresponding to the testing item messages DUT1-MSG~DUT4-MSG. Each of the testing devices I1~I4 may be implemented as an audio testing device, a video testing device, a control signal testing device, a voltage testing device, a frequency testing device, a communication signal testing device, an LED color and brightness testing device, a button testing device (for example, pressing with a gas stick) . . . etc. However, the present disclosure is not limited to this, each of the testing devices I1~I4 may include at least one testing function, and the testing devices I1~I4 may be the same or different types of testing devices.

In the step 230, the arrangement unit PATE generates at least one testing instructions DUT1-INS1~DUT1-INS5, DUT2-INS1~DUT2-INS5, DUT3-INS1~DUT3-INS5, DUT4-INS1~DUT4-INS5 according to at least one testing item message DUT1-MSG~DUT4-MSG. It should be noted that the order of the step 220 and 230 is not limited.

In the step 240, the arrangement unit PATE transmits at least one testing instruction to the corresponding testing device in idle state.

As shown in FIG. 1, the arrangement unit PATE generates at least one testing instruction DUT1-INS1~DUT1-INS5, DUT2-INS1~DUT2-INS5, DUT3-INS1~DUT3-INS5, DUT4-INS1~DUT4-INS5 according to the testing item messages DUT1-MSG~DUT4-MSG, and the arrangement unit PATE may transmit at least one of the corresponding testing instructions DUT1-INS1~DUT1-INS5, DUT2-INS1~DUT2-INS5, DUT3-INS1~DUT3-INS5, DUT4-INS1~DUT4-INS5 to at least one of the testing devices I1~I4 selectively via a wired, wireless network or other communication ways.

The testing instructions DUT1-INS1~DUT1-INS5, DUT2-INS1~DUT2-INS5, DUT3-INS1~DUT3-INS5, DUT4-INS1~DUT4-INS5 include the information of each corresponding device under tests DUT1~DUT4. For example, the arrangement unit PATE generates the testing instructions DUT1-INS1 according to the testing item T1 of the testing item message DUT1-MSG, and transmits the testing instruction DUT1-INS1 to the testing device I1. Accordingly, the testing instruction DUT1-INS1 is configured to designate testing device I1 to test the device under test DUT1 for testing item T1.

The content of the testing instructions DUT1-INS1~DUT1-INS5, DUT2-INS1~DUT2-INS5, DUT3-INS1~DUT3-INS5, DUT4-INS1~DUT4-INS5 according to the testing items T1~T5 may separately include a voltage testing instruction, a frequency testing instruction, a control signal testing instruction, a video HDMI testing instruction and an LED testing instruction.

In addition, the arrangement unit PATE may detect whether the required testing devices I1~I4 are in idle state according to the content of the testing item messages DUT1-MSG~DUT4-MSG. If it is in idle state, the testing instructions DUT1-INS1~DUT1-INS5, DUT2-INS1~DUT2-INS5, DUT3-INS1~DUT3-INS5, DUT4-INS1~DUT4-INS5 are transmitted to the corresponding testing devices I1~I4, in order to prompt the testing devices I1~I4 to test the device under tests DUT1~DUT4 according to the testing instructions DUT1-INS1~DUT1-INS5, DUT2-INS1~DUT2-INS5, DUT3-INS1~DUT3-INS5, DUT4-INS1~DUT4-INS5.

For example, when the testing item message DUT1-MSG transmitted by the device under test DUT1 to the arrangement unit PATE includes the voltage testing item T1, and the arrangement unit PATE detects that the testing device I1 for testing voltage is in idle state, the arrangement unit PATE generates the testing instruction DUT1-INS1, and transmits the testing instruction DUT1-INS1 to the testing device I1. Accordingly, the testing device I1 may be informed by the testing instruction DUT1-INS1 that it is designated to perform voltage testing to the device under test DUT1.

For another example, when the testing item message DUT2-MSG transmitted by the device under test DUT2 to the arrangement unit PATE includes the voltage testing item T1 and the frequency testing item T2, and the arrangement unit PATE detects the testing device I1 of testing voltage and the testing device I2 of testing frequency are in idle state, the arrangement unit PATE generates the testing instructions DUT2-INS1, DUT2-INS2, and transmits the testing instructions DUT2-INS1, DUT2-INS2 to the testing device I1 and the testing device I2. Accordingly, the testing device I1 and the testing device I2 may perform the voltage testing and the frequency testing to the device under test DUT2 respectively by the testing instruction DUT2-INS1 and DUT2-INS2 separately.

Furthermore, when the arrangement unit PATE receives the plurality of the testing item messages DUT1-MSG~DUT4-MSG successively, the arrangement unit PATE deals with the testing item messages according to the principle of first in, first out. For example, when the arrangement unit PATE receives the testing item messages DUT1-MSG and DUT2-MSG in order, the arrangement unit PATE designates at least one of the suitable testing devices I1~I4 according to the content of the testing item messages DUT1-MSG, and then designates at least one of the suitable testing devices I1~I4 according to the content of the testing item message DUT2-MSG.

When the arrangement unit PATE receives a plurality of the testing item messages DUT1-MSG~DUT4-MSG at the same time, the arrangement unit PATE automatically numbers these testing item messages DUT1-MSG~DUT4-MSG and disposes the testing devices I1~I4 according to the numbers.

In addition, the arrangement unit PATE does not need to wait for receiving all the testing item messages DUT1-MSG~DUT4-MSG to start to generate the testing instructions DUT1-INS1~DUT1-INS5, DUT2-INS1~DUT2-INS5, DUT3-INS1~DUT3-INS5, DUT4-INS1~DUT4-INS5 and to detect the idle state of the corresponding testing devices I1~I4. In other words, the arrangement unit PATE may start to execute the step 220 whenever receives at least one testing item message DUT1-MSG~DUT4-MSG.

In the step 250, the testing device in the idle state tests the corresponding device under test according to the at least one testing instruction received and generates a testing result. For example, after the arrangement unit PATE transmits the testing instruction DUT1-INS1 to the testing device I1 in idle state, the testing device I1 tests the device under test DUT1 according to testing instruction DUT1-INS1, and transmits the testing result RS to the arrangement unit PATE (as shown in FIG. 1.)

Please refer to FIG. 4. FIG. 4 is a schematic diagram of the testing result file F2 illustrated accordance of an embodiment of the disclosure. The testing result file F2 is obtained by integrating of the arrangement unit PATE, and includes at least one testing result RS, and the testing result RS is described by a high-level programming language. For example, in the testing result file F2 illustrated in FIG. 5, the first line representing that the testing result RS of the corresponding testing instruction T1 transmitted back to the device under test DUT1 is defined in the line code S05 of the program code by "S05: PATE: Send RTV [DUT1~T1]", wherein the "RTV" representing reply test value. Every line in FIG. 5 represents a testing result, and so as content of line code S06~S09, the details will not be repeated here.

For example, since the previous testing instruction DUT1-INS1 includes the information of the corresponding device under test DUT1, the testing device receiving this testing instruction DUT1-INS1 may know that the device under test DUT1 is being tested. After the testing device I1 completes the testing of the device under test DUT1 and generates the testing result RS, the testing device I1 will transmit back the testing result RS to the arrangement unit PATE. Then, after the arrangement unit PATE receives the testing result RS, the arrangement unit PATE may know that it is corresponding to the device under test UDT1 by the content of the testing result RS, so the arrangement unit PATE may immediately transmit back the testing result RS to the device under test DUT1.

Accordingly, when there are many device under tests and/or many testing items (for example, each of the device under tests DUT1~DUT4 needs the testing items T1~T5 respectively), the testing device (for example, the testing devices I1~I4) does not have to keep waiting and transmit back all the testing result RS in batches to the arrangement unit PATE until all the testing result RS are generated. In another embodiment, the arrangement unit PATE temporarily stores the generated testing result RS in the testing result file F2.

As shown in FIG. 1, after the device under tests DUT1~DUT4 transmit the testing item messages DUT1-MSG~DUT4-MSG to the arrangement unit PATE (step 210), the device under tests DUT1~DUT4 have already prepared the testing signal respectively. For example, when the device under test DUT1 is a mobile device waiting for testing the LED function, after the device under test DUT1 transmits the testing item message DUT1-MSG to the arrangement unit PATE, the device under test DUT1 configures its screen to display an image in order to test the LED function. Then, the arrangement unit PATE disposes the LED testing device (for example, testing device I5) to the device under test DUT1.

Furthermore, the testing system 100 further includes a switch SW configured to communicatively connect to the testing devices I1~I4 and the device under tests DUT1~DUT4. In other words, the testing devices I1~I4 may build a signal channel SIG via the switch SW and the device under tests DUT1~DUT4, the signal channel SIG is configured to transmit or receive the testing signal, for example, when the sound signal of the device under test DUT1 is going to be tested, the switch SW switches to the testing device I1 for sound signal testing, then, the device under test DUT1 may transmit the sound signal to the switch SW, accordingly, the testing device I1 receives the testing signal sent from the device under test DUT1.

The switch SW is configured to build the signal channel SIG between one of the testing devices I1~I5 and the corresponding one of the device under tests DUT1~DUT5. For example, when the arrangement unit PATE designates to test the device under test DUT1 by the testing device I1, the switch SW switches to electrically connect to the testing device I1 and device under test DUT1, so that the testing device I1 and the device under test DUT1 build the signal channel SIG.

As mentioned above, the device under tests DUT1~DUT4 may be tested according to the disposition of the arrangement unit PATE, and the arrangement unit PATE dynamically designates a testing sequence according to an idle state of the testing devices I1~I4, the device under tests DUT1~DUT4 do not need to be tested by the testing devices I1~I4 in a fixed sequence. That is, when the arrangement unit PATE designates the device under tests DUT1~DUT4, the order of the items T1~T5 and the testing devices I1~I4 may not be considered. Therefore, the idle time of the testing devices I1~I4 is significantly reduced and the testing process may be performed more efficiently.

Figure 6:
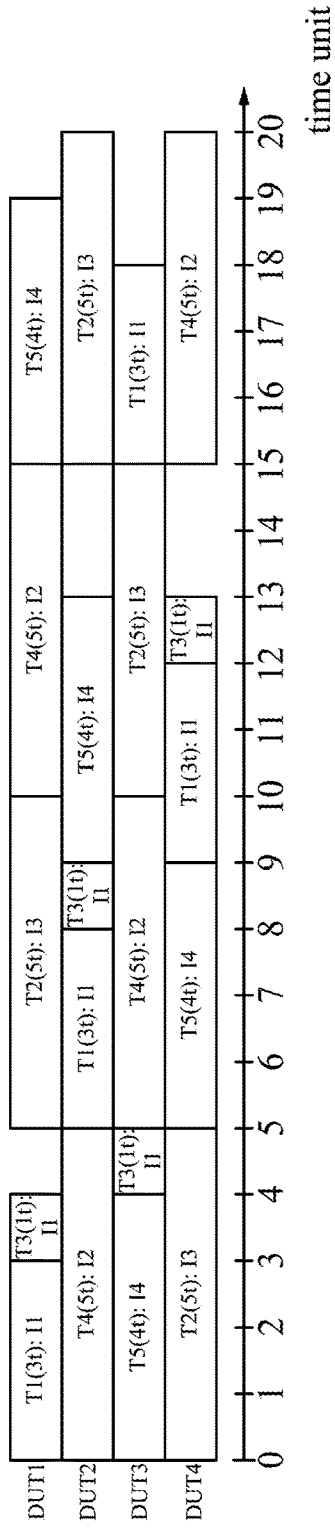
FIG. 6 is a schematic diagram of a testing schedule illustrated in accordance with FIG. 5.
Figure 7:
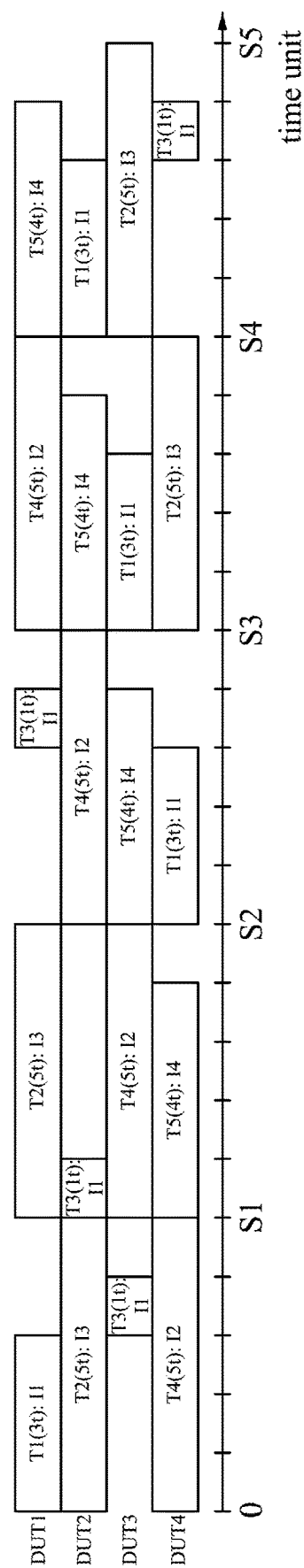
FIG. 7 is a schematic diagram of a traditional testing schedule.

For example, please refer to FIG. 5~7. FIG. 5 is a schematic diagram illustrating the testing item, time of the single device under test and testing by the corresponding testing device in accordance of an embodiment of the disclosure. FIG. 6 is a schematic diagram illustrating a testing schedule in accordance of the testing method of FIG. 5. FIG. 7 is the schematic diagram of the traditional testing schedule. It should be noted that the testing schedule illustrated in FIG. 5 and FIG. 6 has the physical limitations in the testing that each of the testing devices can only detect one device under test at the same time respectively.

In FIG. 5, the symbol t denotes a time unit, in this example, there are four device under tests DUT1~DUT4 in total, each of the device under tests DUT1~DUT4 needs to perform five testing items T1~T5, and there are four testing devices I1~I4, in which, the testing item T1 needs three time units to perform testing by the testing device I1 (denoted by the symbol T1(3$t$):I1 in FIG. 5~7.) The testing item T2 needs five time units to perform testing by the testing device I3 (denoted by the symbol T2(5$t$):I3 in FIG. 5~7.) The testing item T3 needs one time unit to perform testing by the testing device I1 (denoted by the symbol T3(1$t$):I1 in FIG. 5~7.) The testing item T4 needs five time units to perform testing by the testing device I2 (denoted by the symbol T4(5$t$):I2 in FIG. 5~7.) The testing item T5 needs four time units to perform testing by the testing device I4 (denoted by the symbol T5(4$t$):I4 in FIG. 5~7.)

FIG. 6 is used to denote the testing schedule generated according to the foregoing testing flow of the present disclosure. In FIG. 7, the arrangement unit PATE detects that the testing devices I1~I4 are all in idle state at the beginning, then the principle of first in, first out may be applied, that is, to arrange the schedules according to the sequence of the arrangement unit PATE receiving the testing item messages DUT1-MSG~DUT4-MSG corresponding to the device under tests DUT1~DUT4. Accordingly, the testing device I1 tests the testing item T1 of the device under test DUT1, the testing device I2 tests the testing item T4 of the device under test DUT2, the testing device I4 tests the testing item T5 of the device under test DUT3, the testing device I3 tests the testing item T3 of the device under test DUT4. Each of the testing items T1~T5 needs different units time to test, for example, the testing device I1 will complete the testing of the device under test DUT1 after the third time units pass, so after the third time units over, the arrangement unit PATE will detect that the testing device I1 entering to idle state, and then the arrangement unit PATE immediately disposes the testing device I1 to perform the testing of the testing item T3 of the device under test DUT1. Then after one time unit passes, the testing device I1 completes the testing of the testing item T3 of the device under test DUT1, at this moment, the arrangement unit PATE detects that the testing device I1 entering to idle state again (regarded as idle state) and at the same time, the arrangement unit PATE also detects that the testing device I4 has completed the testing of the testing item T5 of the device under test DUT3, so the arrangement unit PATE disposes the testing device I1 to the device under test DUT3 to test the testing item T3, in order to reduce the idle time of the testing device I1 to the lowest.

Similarly, so as the method to dispose the other testing devices I2~I4, the details will not be repeated here.

Thus, according to the example of FIG. 6, the idle rates of the each testing devices I1~I4 may be calculated to be 20%, 0%, 0% and 20% respectively. In an embodiment, the method to calculate the idle rate is, for example, the entire testing process needs 20 time units, the testing device I1 is in idle state for four time units during entire testing process, then the idle rate of the testing device I1 is 20% (4/20=20%), for another example, the testing device I2 is in idle state for zero time unit, then the idle rate of the testing device I2 is 0% (0/20=0%) and so as the calculating method of the idle rate of the other devices. It should be noted that the method to calculate the idle rate is not limited to this.

It can be understood that the testing device in idle state (for example, testing device I1) may test one of the device under tests (for example, device under test DUT1) during anther another testing device (for example, testing device I2) testing another one of the device under tests (for example, device under test DUT2).

On the other hand, the testing schedule schematic diagram shown in FIG. 7 is the traditional testing schedule. This traditional schedule method is applied to find the longest time cost by testing instructions in the testing devices I1~I5 to set time slots S1~S5 for a fixed length of time. In this example, the testing items T2 and T4 need five time units to perform testing, these two are the most time-consuming testing instructions, so each of the time slots S1~S5 is set to include five time units. This traditional method is that the time slots S1~S5 corresponding to different device under tests DUT1~DUT4 are disposed to different testing devices I1~I4 respectively. In the same time slot S1, even the testing device I1 has completed the testing item T3 in this time slot, the testing device I1 still need to wait for all other testing devices I3 in this time slot complete the testing item T2, and then enter the next time slot S2. And so on until each device under tests DUT1~DUT4 completes the testing instructions T1~T5 respectively.

As shown in FIG. 7, the traditional schedule method needs 25 time units in total, and the idle rates of the testing devices I1~I4 are 36%, 20%, 20% and 36% respectively (according to the aforementioned calculation of idle rate to obtain.)

It can be understood that comparing to the testing schedule shown in FIG. 6 and the traditional testing schedule shown in FIG. 7, the testing schedule of the present disclosure can significantly reduce the idle rates of the testing devices I1~I4 and quickly complete the testing items of each device under tests DUT1~DUT4 needing to be tested. Furthermore, the testing schedule of the present disclosure (as shown in FIG. 6) is disposed by the idle states of the testing devices I1~I4, and the testing devices I1~I4 are independent operation, so the present disclosure does not need to set the time slot to synchronize.

Figure 8:
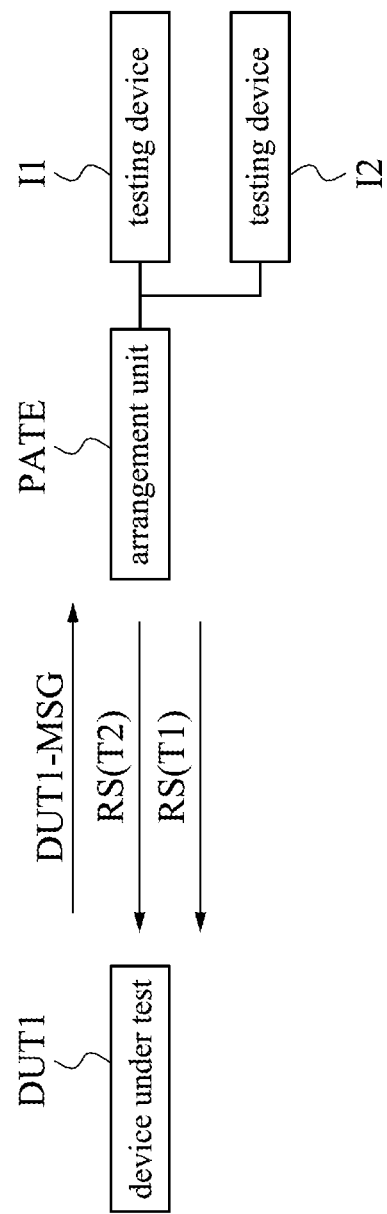
FIG. 8 is a schematic diagram of a testing signal transmitting method illustrated in accordance with an embodiment of the disclosure.

Then, please refer to FIG. 8. FIG. 8 is a schematic diagram illustrating the testing signal transmitting method in accordance to an embodiment of the present disclosure. As shown in FIG. 8, the content of the test item message DUT1-MSG of the device under test DUT1 represents: request to perform testing items T1 and T2. After the arrangement unit PATE receives the testing item message DUT1-MSG, the arrangement unit PATE designates the corresponding testing devices I1 and I2 to test according to the schedule, so as to obtain the testing result RS(T2) corresponding to the testing item T2 and the testing result RS(T1) corresponding to the testing item T1, and transmit back the testing result RS(T2), RS(T1) to the device under test DUT1. In this example, only three control messages are used back and forth.

As mentioned above, the testing signal transmitting method shown in FIG. 8 of the present disclosure performs testing by the arrangement unit PATE disposing the testing devices I1 and I2, less control signals are required to be transmitted, so the time required to transmit the signals back and forth is reduced, and once the testing devices I1 and I2 generate a testing result RS, it may be transmitted back to the arrangement unit PATE, without waiting until all the testing results complete to transmit back in batches, so the present disclosure may achieve the effect of saving overall testing time.

In summary, compared with the traditional schedule based on the device under tests, the testing system and testing method of the present disclosure are based on the use of the testing devices, so that the idle time of the testing device may be shortened. And the costs of production and time are reduced by reducing the idle time of the testing device to maximize efficiency of testing devices. Furthermore, because the arrangement unit may accept the testing requests anytime, it may dispose which device under test to be tested according to the current states of the testing devices and does not need to wait for batch testing. In addition, since the arrangement unit schedules testing according to the high-level programming language, the testing device in idle state and able for testing corresponding to the testing item may be disposed whether the device under tests are the same types or not, and whether each of the device under tests is tested the same testing item or not, so that the testing flow of the products is more flexible, thus even a small number of different types of products may also be included in the testing schedule for testing.

Therefore, the present disclosure provides an arrangement unit, a testing system and a testing method, so that the staff developing a device under test only needs to focus on how to generate a signal for device under tests, and staff in charge of operating the arrangement unit only needs to focus on the control of the testing device, and the dependency between the device under test and the arrangement unit is low, so that the process of testing may perform in parallel to shorten the testing time.

The terminology used herein is for the purpose of describing particular embodiments only and is not intended to be limiting of the invention. Those skilled in the art should also realize that such equivalent constructions do not depart from the spirit and scope of the present disclosure, and that they can make various changes, substitutions and alterations herein without departing from the spirit and scope of the present disclosure.

What is claimed is:

1. A testing system suitable for receiving at least one testing item from a plurality of device under tests (DUTs), comprising:

a plurality of testing devices configured to test the DUTs corresponding to the at least one testing item; and an arrangement unit electrically connected to the testing devices and configured to generate at least one testing instruction according to the at least one testing item, detect an idle state of the testing devices corresponding to the at least one testing item, and transmit the at least one testing instruction to the corresponding testing device in the idle state, so that the testing device in the idle state tests the corresponding DUT according to the at least one testing instruction and generates a testing result, and the arrangement unit transmits the testing result to the corresponding DUT when the at least one of the testing device generates the testing result and transmits the testing result to the arrangement unit.

2. The testing system of claim 1, wherein the testing device in the idle state is configured to test another one of the DUTs during another one of the testing devices testing the one of the DUTs.

3. The testing system of claim 1, further comprising a switch communicatively connected to the testing devices and the DUTs, wherein the testing devices receive a testing signal transmitted by the DUTs via the switch.

4. The testing system of claim 1, wherein the arrangement unit is configured to dynamically arrange a testing sequence according to the idle state of the testing devices.

5. A testing method suitable for a testing system comprising a plurality of testing devices and an arrangement unit, wherein the testing method comprises:
receiving at least one testing item from a plurality of DUTs by the arrangement unit;
detecting an idle state of the testing devices corresponding to the at least one testing item by the arrangement unit;
generating at least one testing instruction according to the at least one testing item by the arrangement unit;
transmitting the at least one testing instruction to the corresponding testing device in the idle state by the arrangement unit;
testing the corresponding DUT according to the at least one testing instruction and generating a testing result by the testing device in the idle state; and
transmitting the testing result to the corresponding DUTs by the arrangement unit when the at least one of the testing device generates the testing result and transmits the testing result to the arrangement unit.

6. The testing method of claim 5, wherein the testing device in the idle state is able to test another one of the DUTs during another one of the testing devices testing the one of the DUTs.

7. The testing method of claim 5, wherein the testing devices are configured to receive a testing signal from the DUTs via a switch.

8. The testing method of claim 5, wherein the arrangement unit is configured to dynamically arrange a testing sequence according to the idle state of the testing devices.

9. An arrangement unit suitable for receiving at least one testing item of a plurality of DUTs and electrically connected to a plurality of testing devices, wherein the arrangement unit comprises:
a communication interface configured to receive the at least one testing item;
a processor electrically connected to the communication interface, and configured to generate at least one testing instruction according to the at least one testing item, detect an idle state of the testing devices corresponding to the at least one testing item, and transmit the at least one testing instruction to the corresponding testing device in the idle state, such that the testing device in the idle state is configured to test the corresponding DUT according to the at least one testing instruction and generate a testing result to transmit to the arrangement unit, and the arrangement unit transmits the testing result to the corresponding DUTs.

* * * * *